US006764803B2

(12) United States Patent
Koops et al.

(10) Patent No.: US 6,764,803 B2
(45) Date of Patent: Jul. 20, 2004

(54) LASER TRANSFER FILM FOR DURABLE INSCRIPTION ON COMPONENTS

(75) Inventors: Arne Koops, Breitenfelde (DE); Sven Reiter, Hamburg (DE)

(73) Assignee: tesa AG, Hamburg (DE)

( * ) Notice: Subject to any disclaimer, the term of this patent is extended or adjusted under 35 U.S.C. 154(b) by 0 days.

(21) Appl. No.: 09/988,510

(22) Filed: Nov. 20, 2001

(65) Prior Publication Data

US 2003/0104309 A1 Jun. 5, 2003

(30) Foreign Application Priority Data

Oct. 25, 2001 (DE) ........................................ 101 52 073

(51) Int. Cl.[7] .............................. G03F 7/34; G03F 7/11

(52) U.S. Cl. .................... 430/201; 430/200; 430/270.1; 430/273.1

(58) Field of Search ................................ 430/200, 201, 430/270.1, 273.1

(56) References Cited

U.S. PATENT DOCUMENTS

| | | | | |
|---|---|---|---|---|
| 4,841,652 A | | 6/1989 | Sakashita et al. | 40/299 |
| 5,156,938 A | * | 10/1992 | Foley et al. | 430/201 |
| 5,429,909 A | | 7/1995 | Kaszczuk et al. | 430/273 |
| 5,614,050 A | | 3/1997 | Carsten et al. | 156/231 |
| 5,629,129 A | * | 5/1997 | Yamamoto et al. | 430/201 |
| 5,641,506 A | | 6/1997 | Talke et al. | 424/443 |
| 5,693,447 A | * | 12/1997 | Takeyama et al. | 430/201 |
| 5,695,907 A | * | 12/1997 | Chang et al. | 430/201 |
| 5,725,993 A | * | 3/1998 | Bringley et al. | 430/201 |
| 5,831,661 A | | 11/1998 | Tabuchi et al. | 347/262 |
| 5,843,547 A | * | 12/1998 | Kulper et al. | 428/40.1 |
| 5,914,165 A | | 6/1999 | Freedman | 428/40.1 |

FOREIGN PATENT DOCUMENTS

| | | | |
|---|---|---|---|
| DE | 81 30 861.2 | 1/1983 | G09F/3/02 |
| DE | 40 32 776 A1 | 4/1992 | B05D/5/10 |
| DE | 42 37 252 C2 | 5/1994 | C09J/7/02 |
| DE | 43 08 649 C2 | 9/1994 | A61L/15/42 |
| DE | 43 24 748 C1 | 10/1994 | C09J/7/02 |
| DE | 43 13 008 C1 | 11/1994 | C09J/133/06 |
| DE | 695 00 916 T2 | 1/1995 | B41M/5/40 |
| DE | 695 00 454 T2 | 5/1995 | B41M/5/40 |
| DE | 695 00 903 T2 | 6/1995 | B41M/5/40 |
| DE | 195 41 453 A1 | 7/1995 | B41M/5/24 |
| DE | 199 09 723 C | 9/2000 | G09F/3/02 |
| EP | 0 353 972 B1 | 2/1990 | A61F/13/02 |
| EP | 0 578 151 A1 | 1/1994 | C09J/133/08 |
| EP | 0 695 646 B1 | 1/1995 | B41M/5/40 |
| EP | 0 679 531 B1 | 5/1995 | B41M/5/38 |
| EP | 0 673 791 B1 | 6/1995 | B41M/5/40 |
| EP | 0 845767 A1 | 6/1998 | G09F/3/02 |

OTHER PUBLICATIONS

Abstract of JP 02–1 75 291A.
Abstract of EP 0 695 646 A1.
Abstract of EP 0 679 531 A1.

* cited by examiner

*Primary Examiner*—Richard L. Schilling
(74) *Attorney, Agent, or Firm*—Norris McLaughlin & Marcus PA

(57) ABSTRACT

Laser transfer film for durable inscription on components made from at least one backing layer, where on at least part of the underside of the backing layer there is an adhesion layer, wherein a pigment layer which comprises at least one laser-sensitive pigment has been applied to at least part of the adhesion layer and/or backing layer.

12 Claims, 3 Drawing Sheets

LASER TRANSFER FILM FOR DURABLE INSCRIPTION ON COMPONENTS

Figure 1:
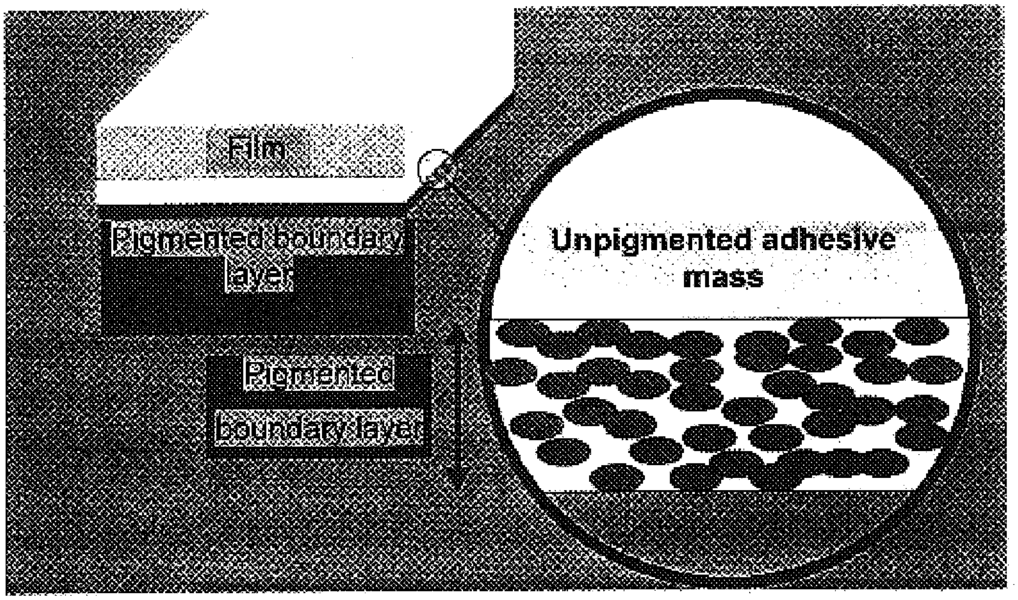

The invention relates to a laser transfer film for durable inscription on components made from a backing layer, where on the underside of the backing layer there is an adhesion layer with pigmented boundary layer.

Technical labeling is one of the methods used for the identification marking of components on vehicles, on machinery, and on electrical and electronic devices, examples being model-identification plates, labels for process control, and guarantee batches and test batches.

Increasing importance is being attached to identification marking by means of laser labels or printed or coated metal plates, specifically in the automotive industry, in particular for high-quality markings. This method is used to place information and advice, such as tire pressure or fuel type, on a very wide variety of components in the automobile for its subsequent user. A laser label may also be used to convey important production data within upstream stages of manufacture.

For this use, the label may be inscribed with a bar code. A suitable reading device gives an assembly team the opportunity of using the bar code for read-off of information concerning model, color, and special equipment, directly on the manufacturing line. Labels are used on the vehicle not only for this standard information but also for the placing of sensitive security data, such as chassis number and identification numbers. In the event of theft or an accident, this information is very important for tracing of a vehicle and of stages in manufacture.

The label material used therefore has to be highly counterfeit-proof, in order to prevent any attempt at manipulation. It has to be impossible to remove the label intact from the base to which it adheres.

Additional security is achieved by using highly breakable material in combination with high adhesive strengths. The adhesive strength of the material on the adhesion base is very significant. It is a decisive factor for resistance to any attempt at manipulation by removal.

Besides the standard material, there are modified labels intended to eliminate any possibility of imitating the material by using other safety features, such as embossments, holograms, or a lasting UV impression (footprint).

There are widely used high-performance controllable lasers for introducing markings, such as inscriptions, codings, and the like, using a burning process. Some of the requirements placed upon the material to receive the inscription, or used for the inscription process, are:

It has to be capable of rapid inscription.

A high degree of spatial resolution capability has to be achieved.

It has to be very simple to use.

The decomposition products have to be non-corrosive.

For particular cases moreover, additional properties are demanded:

The markings produced by applying the laser have to have sufficient contrast to be capable of being read without error even under unfavorable conditions and over large distances.

Heat resistance has to be high, for example extending above 200° C.

Good resistance to weathering, water, and solvents is desirable.

Complete separation of labels from the substrate is possible using sharp, flat blades. The bond between adhesive mass and substrate exhibits particular weaknesses on plastics substrates, such as polyethylene or polypropylene.

Despite increased adhesive strength on metallic or coated substrates, it is also possible here to remove part of the labels without irreversible damage, by using specific tools. A specific tool with a blade can be passed under the label at a shallow angle. Careful cutting movements can lift an edge, producing what is known as a grab site. This method creates a point of attack, which facilitates release.

If printing, rather than a laser label, is used to apply the inscriptions to the component, third parties can easily remove the inscription by washing or scratching. Simple rubbing of the inscribed article on a second article, for example a packing, is also often sufficient to reduce the clarity of the individual letters or numerals.

It is an object of the invention to provide a laser transfer film which permits rapid and precise inscription of any desired component, and which meets the abovementioned demand for improved security against counterfeiting, and which cannot be removed intact, even with the aid of a cutter, and which besides this in particular also has high contrast, high capability for resolution, high heat resistance, and good ease of use.

This object is achieved by means of a laser transfer film as described in the main claim. The subclaims provide particularly advantageous embodiments of the subject-matter of the invention, and also the use of the same.

The invention therefore provides a laser transfer film for durable inscription on components made from at least one backing layer, where on at least part of the underside of the backing layer there is an adhesion layer, wherein a pigment layer which comprises at least one laser-sensitive pigment has been applied to at least part of the adhesion layer and/or backing layer.

It is preferable that the matrix of the layer comprising the laser-sensitive pigments is likewise composed of the adhesive of the adhesion layer, so that the first adhesion layer and the pigment layer form a single homogeneous layer. The pigments have their distribution only in the periphery of the homogeneous layer, and specifically on the side facing away from the backing layer, and in particular in a narrow region of the homogeneous layer, and they therefore form a type of boundary layer.

For further improvement of the adhesion properties of the laser transfer film on the component to receive an inscription, there is preferably a second adhesive layer applied to the pigment layer comprising the laser-sensitive pigment.

A particular manner of application of the second adhesive layer is that of dots or screen print, or, where appropriate, an edge print, the result being that the transfer film can be adhesive-bonded to the substrate in any desired manner.

The thicknesses of the individual layers are preferably selected from the following ranges:

| | |
|---|---|
| Backing layer (preferably PET) | 12 μm–240 μm, particularly 25 μm–100 μm |
| Adhesive mass (preferably acrylate) | 5 μm–45 μm, particularly 10 μm–25 μm |
| Pigment layer | 1 μm–10 μm, particularly 2 μm–5μm |

The films intended for use according to the invention have to be transparent and/or translucent, and at least designed in such a way as to prevent any absorption of the laser beam, which would cause serious damage to the same. In particular, it is desirable that the backing material absorbs no light within the wavelength range from 530 to 1064 nm.

According to the invention, the backing materials used preferably comprise films which, in another outstanding embodiment of the invention, are transparent, in particularly monoaxially or biaxially stretched films based on polyolefins, i.e. films based on stretched polyethylene or on stretched copolymers, comprising ethylene and/or polypropylene units, and, where appropriate, also PVC films, films based on vinyl polymers, on polyamides, on polyester, on polyacetals, or on polycarbonates. PET films in particular have outstanding suitability as backing.

According to the invention, the backing film used also comprise films based on stretched polyethylene or on stretched copolymers comprising ethylene and/or polypropylene units.

Monoaxially stretched polypropylene has a high tensile stress at break and low longitudinal strain. Monoaxially stretched films based on polypropylene are preferred for producing the labels of the invention.

For the last transfer films of the invention, particular preference is given to single-layer biaxially or monoaxially stretched films and multilayer biaxial or monoaxial films based on polypropylene which have a sufficiently strong bond between the layers, since delamination of the layers during use is disadvantageous.

Films based on rigid PVC or films based on plasticized PVC may be used for producing laser transfer films.

For the laser transfer films of the invention, it is preferable to use films based on rigid PVC.

Films based on polyester, for example polyethylene terephthalate, are likewise known and may also be used for producing the transfer films of the invention.

Polyesters are polymers whose skeletal units are held together by ester bonds (—CO—O—). The materials known as homopolyesters may be divided into two groups according to their chemical structure, the hydroxycarboxylic acid types (AB polyesters), and the dihydroxy dicarboxylic acid types (AA-BB polyesters).

The former are prepared from just one single monomer, for example by polycondensing a ω-hydroxycarboxylic acid 1, or by ring-opening polymerization of cyclic esters (lactones) 2, for example

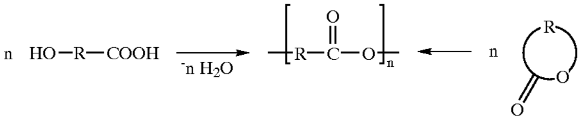

1 I 2

The structure of the latter arises, in contrast, by polycondensing two complementary monomers, for example a diol 3 and a dicarboxylic acid 4:

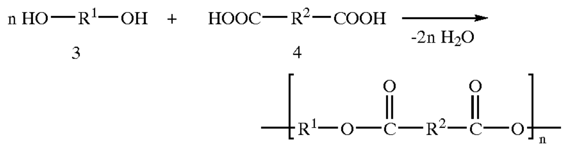

3 4

II

Branched and crosslinked polyesters are obtained by polycondensing tri- or polyhydric alcohols with polyfunctional carboxylic acids. Polycarbonates (polyesters of carbonic acid) are generally also regarded as polyesters.

Examples of AB-type polyesters (I) are polyglycolic acids (polyglycolides, R=CH2), polylactic acids (polylactides, R=CH—CH3), polyhydroxybutyric acid [poly (3-hydroxybutyric acid), R=CH(CH3)—CH2], poly (εcaprolactone)s [R=(CH2)5], and polyhydroxybenzoic acids (R=C6H4).

AA-BB-type polyesters (II) which are purely aliphatic are polycondensates made from aliphatic diols and dicarboxylic acids, and are used, inter alia, as products having terminal hydroxyl groups (as polydiols) for preparing polyester polyurethanes (an example being polytetramethylene adipate; R1=R2=(CH2)4].

In quantity terms, the greatest industrial significance attaches to AA-BB type polyesters made from aliphatic diols and from aromatic dicarboxylic acids, in particular the polyalkylene terephthalates [R2=C6H4, including polyethylene terephthalate (PET) R1=(CH2)2, polybutylene terephthalate (PBT) R1=(CH2)4, and poly(1,4-cyclohexanedimethylene terephthalate)s (PCDT) R1=CH2—C6H10—CH2], which are the most important representatives. These types of polyester can be given widely varying properties and be adapted to various application sectors through concomitant use of other aromatic dicarboxylic acids, (for example isophthalic acid) and, respectively, through the use of diol mixtures during the polycondensation.

Polyesters which are purely aromatic are the polyarylates, which include poly(4-hydroxybenzoic acid) (formula I, R=C6H4and phthalic acids (formula II, R1=C6H4—C (CH3)2—C6H4, R2=C6H4), or else made from bisphenols and phosgene.

The laser transfer films of the invention may comprise a self-adhesive mass based on natural rubber, on PU, on acrylates, or on styrene-isoprene-styrene block copolymers.

The use of adhesive masses based on natural rubber, on acrylates, or on styrene-isoprene-stryrene is known, and this also described in the "Handbook of pressure sensitive adhesive technologie [sic], second edition, edited by Donatas Satas, Van Nostrand Reinhold, New York, 1989.

A particular self-adhesive mass used is a commercially available pressure-sensitive adhesive mass based on PU, or on acrylate, or on rubber.

An adhesive mass which has proven particularly advantageous is one based on acrylate hot-melt and having a K value of at least 20, in particular more than 30, obtainable by concentrating a solution of this mass to give a system processable as a hot melt.

The concentration process may take place in appropriately equipped tanks or extruders, and for the associated devolatilization process here particular preference is given to a vented extruder.

An adhesive mass of this type is presented in DE 43 13 008 A1, the content of which of which is hereby incorporated herein by way of reference and is included in this disclosure and invention. The solvent is completely removed in an intermediate step from the acrylate masses prepared in this way.

At the same time, other volatile constituents are also removed. After coating of these masses from the melt, they have only small remaining contents of volatile constituents. Any of the monomers/mixes claimed in the abovementioned patent may therefore be adopted. Another advantage of the masses described in the patent is that they have a high K value and therefore a high molecular weight. The skilled worker is aware that systems with relatively high molecular weights can be crosslinked more efficiently. The result is a corresponding reduction in the content of volatile constituents.

The solution of the mass may comprise from 5 to 80 % by weight, in particular from 30 to 70% by weight, of solvents.

It is preferable to use commercially available solvents, in particular low-boiling hydrocarbons, ketones, alcohols, and/or esters.

Preference is also given to the use of single-screw, twin-screw, or multiscrew extruders with one, or in particular two or more, devolatilizing units. In the adhesive mass based on acrylate hot melt there may be benzoin derivatives incorporated into the polymer, e.g. benzoin acrylate or benzoin methacrylate, or acrylic esters or methacrylic esters. Benzoin derivatives of this type are described in EP 0 578 151 A1.

The adhesive mass based on acrylate hot melt may, however, also have been chemically crosslinked.

In one particularly preferred embodiment, the self-adhesive masses used comprise copolymers made from (meth)acrylic acid and esters thereof having from 1 to 25 carbon atoms, maleic, fumaric and/or itaconic acid, and/or esters thereof, substituted (meth)acrylamides, maleic anhydride and other vinyl compounds, such as vinyl esters, in particular vinyl acetate, vinyl alcohols, and/or vinyl ethers.

The residual solvent content should be less than 1% by weight.

An adhesive mass found to be particularly suitable is a low-molecular-weight acrylate hot melt adhesive mass as available from BASF with the name acResin UV or Acronal®, in particular Acronal DS 3458. This adhesive mass has a low K value and undergoes a final crosslinking initiated by radiation chemistry in order to obtain properties appropriate to its use.

Another adhesive mass which may be used is composed of the group of natural rubbers or of the synthetic rubbers, or of an desired blend of natural rubbers and/or synthetic rubbers, where the natural rubber or the natural rubbers may in principle be selected from any of the available grades, such as crepe, RSS, ADS, TSR, or CV grades, depending on the purity level and viscosity level needed, and the synthetic rubber or the synthetic rubbers may be selected from the group consisting of the randomly copolymerized styrene-butadiene rubbers (SBR), the butadiene rubbers (BR), the synthetic polyisoprenes (IR), the butyl rubbers (IIR), the halogenated butyl rubbers (XIIR), the acrylate rubbers (ACM), the ethylene-vinyl acetate copolymers (EVA), and the polyurethanes, and/or blends thereof.

The rubbers may preferably also have thermoplastic elastomers added, at a proportion by weight of from 10 to 50% by weight, based on the total elastomer content, to improve processability.

Representatives which may be mentioned at this point are especially the particularly compatible styrene-isoprene-styrene (SIS) and styrene-butadiene-styrene (SBS) grades.

As tackifying resins, use may be made of any, without exception, of the adhesive resins which are known and described in the literature. Representatives which may be mentioned are the rosins and their disproportionated, hydrogenated, polymerized, or esterified derivatives and salts, the aliphatic and aromatic hydrocarbon resins, terpene resins, and terpene phenol resins. Any desired combinations of these and other resins may be used in order to establish the desired properties of the resultant adhesive mass. Express reference is made to the prior art presented in "Handbook of Pressure Sensitive Adhesive Technology" by Donatas Satas (van Nostrand, 1989).

Hydrocarbon resin is a collective term for thermoplastic polymers which are colorless to intensely brown in color, with a molar mass which is generally <2000.

They can be divided up into three major groups according to their source: petroleum resins, coal tar resins and terpene resins. The most important coal tar resins are the coumarone-indene resins. Hydrocarbon resins are obtained by polymerizing the unsaturated compounds which can be isolated from the raw materials.

Polymers which have appropriately low molecular weight and are obtainable by polymerizing monomers such as styrene or by polycondensation reactions (certain formaldehyde resins) are also regarded as hydrocarbon resins. Hydrocarbon resins are products whose softening range varies within wide boundaries from <0° C. (in the case of hydrocarbon resins liquid at 20° C.) to >200° C., and with density of from about 0.9 to 1.2 g/cm$^3$.

They are soluble in organic solvents, such as ethers, esters, ketones, and chlorinated hydrocarbons, and insoluble in alcohols and water.

Rosin means a naturally occurring resin obtained from the crude resin from conifers. Distinction is made between three types of rosin: balsam resin, a residue from distilling turpentine oil, wood resin, an extract from conifer stumps, and tall resin, a residue from the distillation of tall oil. In volume terms, balsam resin is the most significant.

Rosin is a transparent brittle product, red to brown in color. It is insoluble in water, but soluble in many organic solvents, such as (chlorinated) aliphatic or aromatic hydrocarbons, esters, ethers, and ketones, and also in vegetable and mineral oils. The softening point of rosin is in the range from about 70 to 80° C.

Rosin is a mixture made from about 90% of resin acids and 10% of neutral substances (fatty acid esters, terpene alcohols, and hydrocarbons). The most important resin acids for rosins are unsaturated carboxylic acids of empirical formula C20H30O2, abietic, neoabietic, levopimaric, pimaric, isopimaric, and palustric acid, and also hydrogenated and dehydrogenated abietic acid.

The quantitative proportions of these acids vary as a function of the source of the rosin.

Plasticizers which may be used are any of the known plasticizing substances. These include, inter alia, the paraffinic and naphthenic oils, (functionalized) oligomers, such as oligobutadienes and -isoprenes, liquid nitrile rubbers, liquid terpene resins, vegetable and animal oils and fats, phthalates, and functionalized acrylates.

For thermal induction of chemical crosslinking, use may be made of any known thermally activatable chemical crosslinkers, for example accelerated sulfur or sulfur donor systems, isocyanate systems, reactive melamine resins, formaldehyde resins, and (optionally halogenated) phenol-formaldehyde resins, and/or reactive phenolic resin or reactive diisocyanate crosslinking systems, in each case with the appropriate activators, epoxidized polyester resins or epoxidized acrylate resins, or combinations thereof. The crosslinkers are preferably activated at temperatures above 50° C., in particular at temperatures of from 100° C. to 160° C., very particularly preferably at temperatures of from 110° C. to 140° C.

IR radiation or high-energy alternating fields may also be used for a thermal excitation of the crosslinkers.

The adhesive masses intended for use according to the invention are intended to be transparent and/or translucent, and at least to be such as to eliminate any absorption of the laser beam, which would cause irreversible damage to the same. In particular, it is desirable that the adhesive mass absorbs no light within the range of wavelengths from 530 to 1064 nm.

The form in which the laser-sensitive pigment is applied to the first adhesion layer is preferably that of a solvent suspension, for example an isopropanol suspension.

The suspension in particular solvates the surface of the first adhesive layer, enabling the pigment to become embedded in the periphery of the adhesion layer, indeed the boundary layer, through swelling of the polymer matrix of the adhesive mass, while the solvent evaporates. The pigment layer comprising the laser-sensitive pigment is formed by the boundary layer. The thickness of the boundary layer is in particular from 2 μm to 5 μm.

Particularly suitable additives are color pigments and metal salts. Use is particularly made of pigments from the company TherMark, for example TherMark 120-30F, these being metal oxides, for example molybdenum trioxide. It is also possible to use mixtures of two or more pigments or blends of pigments and glass particles, as are obtainable from the company Merck and can give rise to a sintering process. The additive may be used in addition to the additive titanium dioxide.

These additives are admixed with the suspension for forming the layer (for example as described in DE G 81 30 861), in particular at a level of from a few parts per thousand to a maximum of 10 percent, preferably in amounts of from 0.1 to 10% by weight, in particular from 0.5 to 6% by weight, based on the total weight of the layer, the concentrations being very particularly advantageously from 0.5% by weight, 1% by weight, and 2.5% by weight, and 4% by weight.

There is also a variety of pigments from the company Merck (for example the pearl-luster pigments EM 143220 and BR 3-01) and the 120-30 F TherMark pigments® (black) with outstanding suitability.

When standard lasers are used, specifically the widely used Nd-YAG solid state lasers with wavelength 1.06 μm, the laser beam penetrates the backing layer and the adhesion layer and encounters the pigment. The energy is absorbed, and a sublimation process occurs in which the pigment is transferred to the substrate and bonds durably and stabily to the substrate.

Sharp, high-contrast inscriptions and identification markings are obtained.

The known processes of direct or indirect application are suitable for applying the adhesive mass to the backing material, and also for applying the layer comprising the laser-sensitive pigment.

Mention may be made of the Accugravur process, the doctor-blade process, the doctor roller process, the RCC process, the Super Reco process, the RAM process, and also of the use of an air brush, and casting processes, and also screen-printing processes.

Acrylate hot melts may be applied to the backings mentioned not only by the standard application processes, such as direct coating from nozzles, by way of rolls, and the like, but also by the transfer process, as disclosed in DE 43 24 748 C2. In this case, the adhesive mass is first applied to a running continuous belt with antiadhesive properties and then transferred to the backing material in a laminating unit—using pressure and heat if required to improve anchoring of the mass.

It is also possible in principle to apply the adhesive mass from organic solvents or as an aqueous dispersion. However, the economic and environmental advantages of the hot melt supply form are well known.

The adhesive mass and the layer comprising the laser-sensitive pigment may also be applied as points within a grid, by screen printing (DE 42 37 252 C2) in which case the small spots of adhesive may also vary in their size and/or distribution (EP 0 353 972 B1), or by gravure printing (DE 43 08 649 C2) in coherent longitudinal or transverse bars, or by dot-matrix printing, or by flexographic printing.

It is preferable for both layers to be dome-like shapes from screen printing, or else to have been applied in some other pattern, such as grids, stripes, zigzag lines, or else by gravure printing, for example. They may also have been applied by spraying, for example, giving an application profile with some degree of non-uniformity.

In one preferred embodiment, these have been applied in the form of polygeometric domes.

The domes may have various shapes. Preference is given to flattened hemispheres. It is also possible for other shapes and patterns to be applied by printing onto the backing material, for example a printed image in the form of alphanumeric character combinations, or patterns such as grids, stripes, or else assemblies of domes, or zigzag lines.

One possible indirect process for producing a backing coated with an adhesive layer is disclosed in DE 40 32 776 A1.

In that process a) a flowable adhesive mass is applied to an intermediate carrier which has the following properties:
   - under an optical or electronic microscope it can be seen to have a surface which is corrugated, folded, fissured, or furrowed
   - the adhesive mass can easily be removed from its surface,
   - it is substantively impermeable to air,
b) the microscopic air inclusions or solvent inclusions arising between the adhesive mass and the intermediate carrier after coating of the intermediate carrier are expanded by a temperature increase until the surface of the adhesive mass bursts open, and
c) the adhesive mass is then transferred from the intermediate carrier to the final carrier.

In contrast to the porous adhesive coating desired in DE 40 32 776 A1, a very homogeneous, smooth, air-free, and impermeable adhesive coating is advantageous for the subject-matter of the invention. However, these requirements can be complied with by selecting a smooth and homogeneous surface of the intermediate carrier instead of the structured surface described above.

The base for the intermediate carrier may be selected from all of the materials commonly used for such purposes. Woven webs made from glass fiber, polyester, polyamide, or Nomex®, a fiber material from the company DuPont, are particularly advantageous. However, rubber blankets, plastics belts, and the like have also been found to be advantageous. If woven belts are selected, it is advantageous to use those which already have a substantively unstructured surface coating made from plastics. This latter coating promotes the adhesion and homogeneity of the actual surface coating on the base. The surface coating itself ensures the desired easy transfer of the adhesive mass from the intermediate carrier to the final carrier. It is advantageous for this surface of the intermediate carrier to have been coated with an antiadhesive layer, for example one made from crosslinked silicone rubber or from fluoropolymers, such as Teflon®.

The laser transfer film of the invention has outstanding properties, in particular much better than those of transfer films which have laser-sensitive pigments homogeneously distributed within the adhesive mass layer, where a high level of interaction between laser beam and pigment and adhesive mass takes place. This results in thermal stress which can even cause irreversible damage to the film (melting). The [sic] the result can be a markedly adverse effect on the adhesive mass the [sic] in terms of its temporary adhesive-bonding property (adhesive mass balling) and in the transfer of the pigments into or onto the component.

When the film of the invention is used on coatings or plastics sheets (PP), the pigmented boundary layer oriented toward the component to be adhesive-bonded results in a lasting inscription on the component, rather than the adverse effects.

Compared with the homogeneous distribution of the pigment in the entire adhesive mass, additional advantages results from lower pigment usage and consequently from fewer problems in pigment dispersion, and a low level of interaction between laser beam, pigment, and adhesive mass.

The inscription result achieved is very good. A surprisingly low level of smoke formation is also found. The inscription produced by the marks, directly after the inscription process, was slightly wider but very high in contrast. The contrast reduces slightly after polishing, but it is compensated by the fact that the outlines of the marking become somewhat sharper.

The film of the invention can also be used with outstanding results on rough surfaces, for example on ceramics sockets of Osram fuses, or generally on glass.

The superior features are realized to full effect in the form of a stamp label, a label which may be applied to the component and laser-irradiated. After the inscription process it is peeled off. The procedure is complete.

The laser transfer film of the invention may be presented in the form of a continuous role, this [sic] is wound up in archimedian screw form around at least one cardboard tube, or in the form of a stamped label. The latter may be of any desired design, with an outstanding level of adaptation to the particular application.

Using the figures described below, particularly advantageous embodiments of the film of the invention are illustrated in further detail, without the intention of any unnecessary limitation of the invention.

Figure 2:
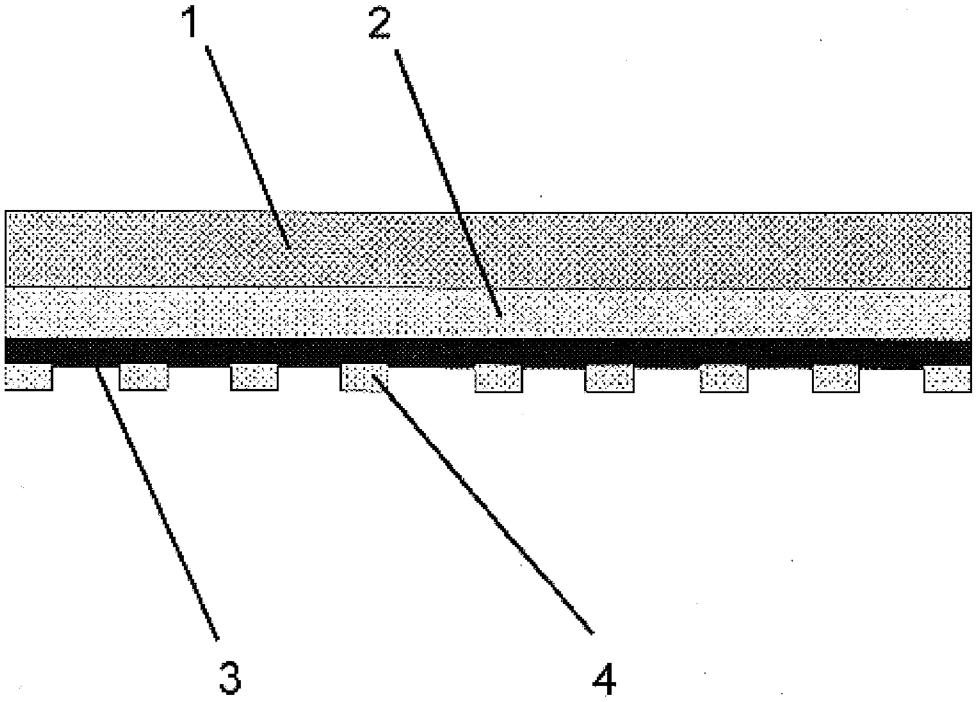
Figure 3:
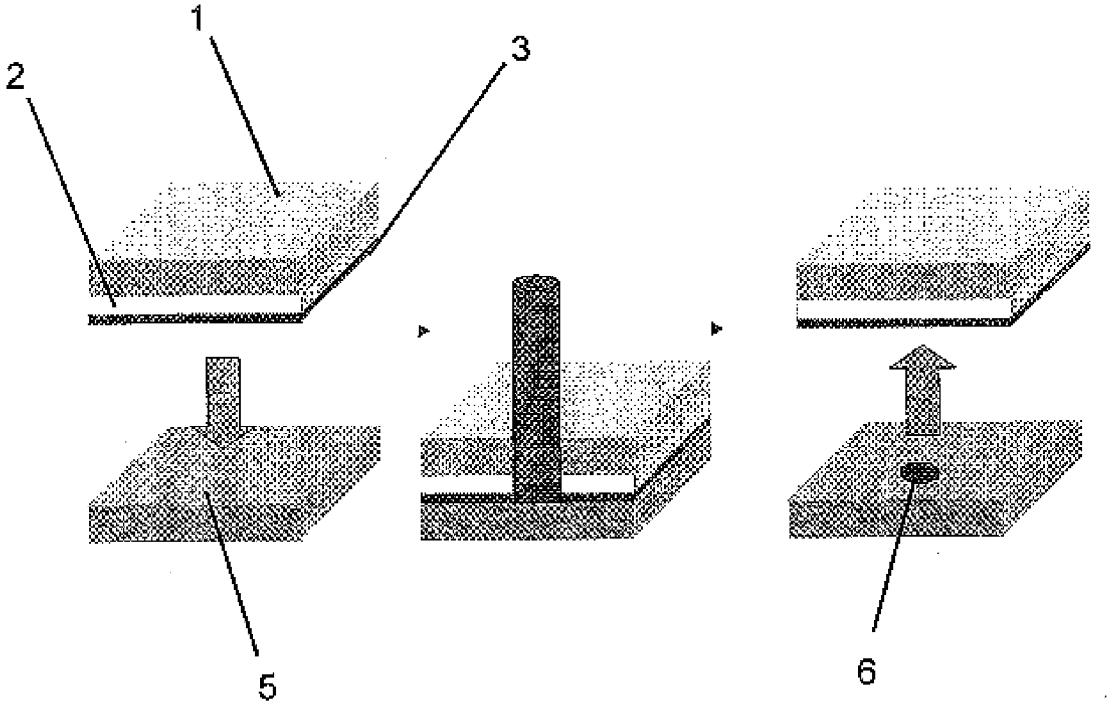

FIG. 1 shows the structure of a film of the invention in the form of a label, FIG. 2 shows the structure of a film of the invention in the form of a label, an additional second adhesive layer having been applied, FIG. 3 shows the procedure for the inscription of a component using the film of the invention.

FIG. 1 shows the structure of a film of the invention in the form of a label. The film is composed of the backing layer 1, of the first adhesive layer 2, applied over the full surface of the backing material 1, and of the layer 3 comprising the laser-sensitive pigment.

The layer 3 has also been applied over the entire surface.

FIG. 2 shows the structure of a film of the invention in the form of a label, an additional second adhesive layer 4 having been applied. The application of this adhesive layer is only partial, in the form of individual rounded profiles.

These serve as fastening points or as an aid to positioning of the film on the substrate.

FIG. 3 discloses the procedure for inscription on a component 5 using the film of the invention. First, the laser transfer film, ideally in the form of a label, is applied to the component 5, adhesion and securing of the label being achieved via the adhesion layer 2. The inscription process then takes place by means of a laser, indicated by the red cylinder.

Once the inscription procedure has ended, the transfer film is removed, and the desired inscription 6 remains on the component.

What is claimed is:

1. A laser transfer film for durable inscription on a component, the film comprising at least one backing layer, the underside of the backing layer having a layer of adhesive applied thereto, and wherein at least a portion of the adhesive layer also comprises a pigment layer, said pigment layer comprising at least one laser-sensitive pigment, and wherein said laser-sensitive pigments or metal salts are introduced into a boundary layer.

2. The laser transfer film as claimed in claim 1, wherein the matrix of the pigment layer comprising the laser-sensitive pigments is formed of the same adhesive as said adhesion layer, so that the first adhesion layer and the pigment layer form a single homogeneous layer.

3. The laser transfer film as claimed in claim 1, wherein a second adhesive layer is applied to the pigment layer comprising the laser-sensitive pigment.

4. The laser transfer film as in claim 1, wherein said backing layer is comprised of a monoaxially or biaxially stretched polymer film wherein the polymer film comprises at least one polymer or copolymer selected from the group consisting of polyolefins, vinyl polymers, potyamides, polyesters, polyacetals, and polycarbonates.

5. The laser transfer film as claimed in claim 1, wherein the adhesive layer comprises a self-adhesive mass based on a member of the group consisting of natural rubber, PU, acrylates, and styrene-isoprene-styrene block copolymers.

6. The laser transfer film as claimed in claim 1, wherein the backing layer and the adhesive mass are transparent or translucent, at least to the extent that no absorption of the laser beams which would cause serious damage to them can take place.

7. The laser transfer film of claim 1, wherein said color pigments or metal salts are selected from the group consisting of metal oxides and mixtures of pigments with glass particles.

8. A method for applying a durable inscription onto a surface of glass, ceramics or metal, the method comprising the steps of applying the laser transfer film of claim 1 to the surface, exposing the applied laser transfer film to laser irradiation in manner effective to transfer an image from the transfer film to the surface, and, removing the laser-exposed transfer film from the surface.

9. A method for applying a durable inscription onto coatings or plastic surfaces, the method comprising the steps of applying laser transfer film of claim 1 to the surface or coating, exposing the applied laser transfer film to laser irradiation in a manner effective to transfer an image from the transfer film to the surface or coating, and, removing the laser-exposed transfer film from the surface or coating.

10. A stamped label comprising the laser transfer film of claim 1.

11. The laser transfer film of claim 4, wherein said polyolefin is polyethylene or a copolymer comprising polyethylene units, polyproylene units or both.

12. The laser transfer film of claim 4, wherein the films comprising said laser transfer film are transparent.

* * * * *

UNITED STATES PATENT AND TRADEMARK OFFICE

CERTIFICATE OF CORRECTION

PATENT NO. : 6,764,803 B2 — Page 1 of 1
DATED : July 20, 2004
INVENTOR(S) : Koops et al.

It is certified that error appears in the above-identified patent and that said Letters Patent is hereby corrected as shown below:

<u>Column 4,</u>
Lines 27-28, "(formula I, R=C6H4and phthalic acids" should read -- formula I, R=C6H4), polycondensates made from bisphenol A and phthalic acids --

<u>Column 10,</u>
Line 22, "potyamides" should read -- polyamides --

Signed and Sealed this

Twenty-first Day of December, 2004

JON W. DUDAS
*Director of the United States Patent and Trademark Office*